United States Patent
Tiu et al.

(10) Patent No.: US 9,190,352 B2
(45) Date of Patent: Nov. 17, 2015

(54) MULTI-DIE SENSOR DEVICE

(71) Applicants: Kong Bee Tiu, Port Klang (MY); Teck Beng Lau, Petaling Jaya (MY); Wai Yew Lo, Petaling Jaya (MY)

(72) Inventors: Kong Bee Tiu, Port Klang (MY); Teck Beng Lau, Petaling Jaya (MY); Wai Yew Lo, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 42 days.

(21) Appl. No.: 14/086,942

(22) Filed: Nov. 21, 2013

(65) Prior Publication Data

US 2015/0137279 A1    May 21, 2015

(51) Int. Cl.
| | |
|---|---|
| H01L 23/495 | (2006.01) |
| G01L 19/14 | (2006.01) |
| H01L 23/24 | (2006.01) |
| H01L 23/31 | (2006.01) |
| H01L 23/00 | (2006.01) |

(52) U.S. Cl.
CPC ........ *H01L 23/49575* (2013.01); *G01L 19/141* (2013.01); *H01L 23/24* (2013.01); *H01L 23/315* (2013.01); *H01L 23/3107* (2013.01); *H01L 23/49551* (2013.01); *H01L 24/32* (2013.01); *H01L 24/48* (2013.01); *H01L 24/73* (2013.01); *H01L 2224/32145* (2013.01); *H01L 2224/32225* (2013.01); *H01L 2224/32245* (2013.01); *H01L 2224/48091* (2013.01); *H01L 2224/48145* (2013.01); *H01L 2224/48247* (2013.01); *H01L 2224/73265* (2013.01); *H01L 2924/14* (2013.01); *H01L 2924/167* (2013.01); *H01L 2924/16151* (2013.01); *H01L 2924/16195* (2013.01); *H01L 2924/1815* (2013.01)

(58) Field of Classification Search
None
See application file for complete search history.

(56) References Cited

U.S. PATENT DOCUMENTS

| | | | |
|---|---|---|---|
| 6,379,988 B1 | 4/2002 | Peterson | |
| 6,891,239 B2 | 5/2005 | Anderson | |
| 6,927,482 B1 | 8/2005 | Kim | |
| 7,040,154 B2 | 5/2006 | Shaw | |
| 7,060,216 B2 | 6/2006 | Schuurmans | |
| 7,384,819 B2 | 6/2008 | Yip | |
| 7,781,852 B1 | 8/2010 | Faheem | |
| 8,049,290 B2 * | 11/2011 | Raben | G01L 19/141 257/433 |
| 8,359,927 B2 | 1/2013 | Hooper | |
| 8,686,550 B2 | 4/2014 | McDonald et al. | |
| 2005/0146000 A1 * | 7/2005 | Kim et al. | 257/670 |
| 2006/0185429 A1 | 8/2006 | Liu et al. | |
| 2007/0164402 A1 * | 7/2007 | Jung | G01L 19/141 257/666 |
| 2008/0159691 A1 * | 7/2008 | Aki | 385/24 |
| 2009/0045498 A1 * | 2/2009 | Braden et al. | 257/687 |
| 2009/0096041 A1 * | 4/2009 | Sakakibara et al. | 257/419 |
| 2009/0134481 A1 | 5/2009 | Sengupta | |
| 2011/0260266 A1 * | 10/2011 | Han et al. | 257/415 |
| 2013/0075884 A1 | 3/2013 | Gong | |
| 2013/0264662 A1 | 10/2013 | Baldo et al. | |
| 2013/0341737 A1 | 12/2013 | Bryzek et al. | |
| 2014/0015069 A1 | 1/2014 | Liang et al. | |
| 2014/0374848 A1 | 12/2014 | Koh et al. | |

* cited by examiner

*Primary Examiner* — Benjamin Sandvik
(74) *Attorney, Agent, or Firm* — Charles Bergere

(57) ABSTRACT

A semiconductor device includes a lead frame having a flag and leads that surround the flag. The leads include a dummy lead that has first and second wire bonding areas. A first die is attached on the flag and electrically connected to the first wire bonding area. The first die and the first wire bonding area are encapsulated with a molding material and a cavity with an opening is formed above the first die. The second wire bonding area is exposed in the cavity. A second die is placed in the cavity and electrically connected to the second wire bonding area such that the second die is electrically connected to the first die by way of the dummy lead.

10 Claims, 5 Drawing Sheets

MULTI-DIE SENSOR DEVICE

BACKGROUND OF THE INVENTION

The present invention relates to integrated circuit (IC) device assembly and, more particularly, to multi-die sensor devices.

A multi-die sensor device is a package incorporating multiple integrated circuit dies into a single package, at least one of which is a sensor die. The multiple dies assembled in one package usually are internally connected with wires. A multi-die sensor device performs all or most of the functions of an electronic system, and is widely used in electronic devices.

FIG. 1A is a cross-sectional view of a conventional multi-die sensor device 100 including a lead frame 102 having a flag 104 and a plurality of leads 106 surrounding the flag 104. First and second dies 108 and 110 are attached on a top surface of the flag 104. The first die 108 is electrically connected to at least one of the leads 106 with a first bond wire 112, and the second die 110 is electrically connected to the first die 108 with a second bond wire 114. In addition, a third die 116 is attached on a top surface of the first die 108 with an epoxy and electrically connected to the first die 108 with a third bond wire 118. The multi-die sensor device 100 may be, for example, a sensor device where the first die 108 is a micro-control unit (MCU), the second die 110 is a gravity sensor, and the third die 116 is a pressure sensor. The lead frame 102, the first and second dies 108 and 110, and the first and second bond wires 112 and 114 are encapsulated with a mold compound 120. Since the third die 116 is a pressure sensor die, an opening 122 should be left over the third die 116 so that it may function; however, the third die 116 is covered with a protective gel 124.

The opening 122 is created with a Film Assisted Molding (FAM) process in which an insert wrapped by a film is placed on top of the third die 116 to prevent the mold compound 120 from flowing into the area of the opening 122. However, there is a very narrow process tolerance since a minor offset of the FAM process will damage the first and second bond wires 112 and 114. Further, both insert and mold chase clamping pressures have very tight process windows in order to strike a balance between die cracking and mold bleeding.

FIG. 1B is a cross-sectional view of another conventional multi-die sensor device 200 including a substrate 202 having first and second dies 204 and 206 attached thereon. The first die 204 is electrically connected to a first bonding pad 208 on a top surface of the substrate 202 with a first bond wire 210. Both the first and second dies 204 and 206 are electrically connected to a second bonding pad 212 on the top surface of the substrate 202 respectively with a second bond wire 214 and a third bond wire 216 to electrically connect the second die 206 to the first die 204. A third die 218 is attached on a top surface of the first die 204 with an epoxy material and electrically connected to the first die 204 with a fourth bond wire 220. In the multi-die sensor device 200, the first die 204 is a MCU, the second die 206 is a gravity sensor, and the third die 218 is a pressure sensor. Part of the substrate 202, the second die 206 and the third bond wire 216 are encapsulated with a mold compound 222 through a pre-molding process, more particularly, a compression molding process. Since the third die 218 is a pressure sensor die, an opening 224 is left over top of the first and third dies 204 and 218 after the pre-molding process and then a gel 226 is disposed on a top surface of the third die 218. A lid 228 with a hole 230 is provided to cover the opening 224. However, there is a risk of damaging the diaphragm of the pressure sensor (third die 218) caused by the gel dispensing process. The height of the dispensing needle to the top surface of the third die 218 must be carefully controlled. Furthermore, a large amount of gel 226 is required to coat the first and third dies 204 and 218, and the bond wires 210, 214 and 220.

It is therefore desirable to find a solution to resolve the bond wires and the pressure sensor die protection issues in a sensor device.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1A:
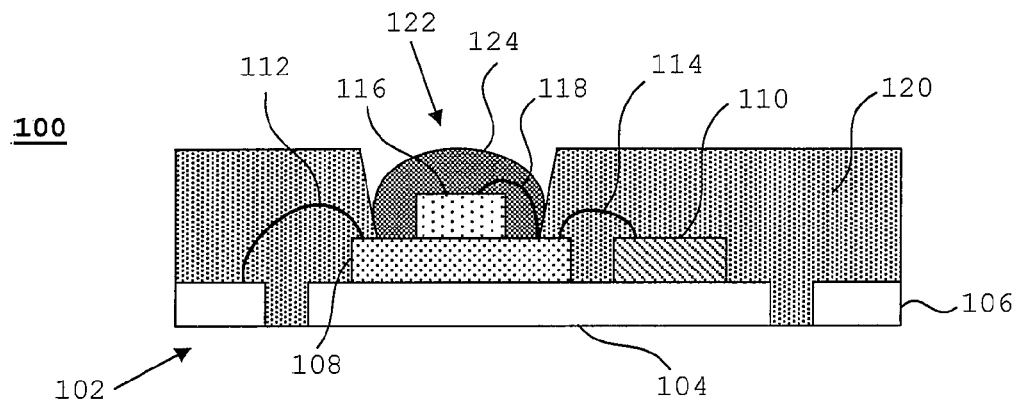
FIG. 1A is a cross-sectional side view of a conventional multi-die sensor device.
Figure 1B:
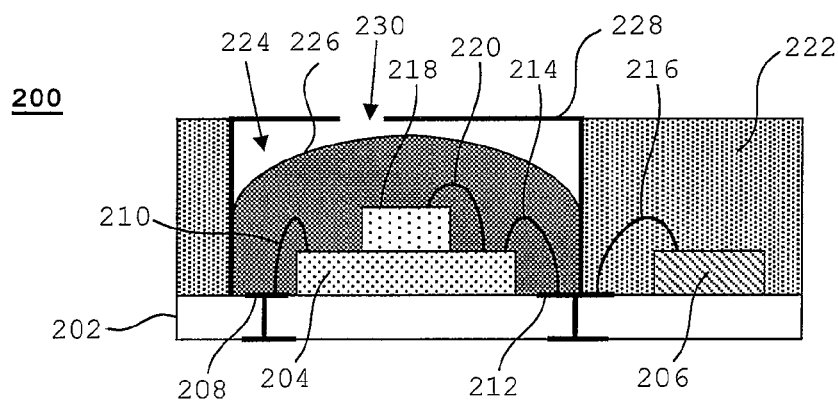
FIG. 1B is a cross-sectional side view of another conventional multi-die sensor device.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a semiconductor device including a lead frame having a flag and a plurality of leads surrounding the flag, wherein the plurality of leads includes at least one normal lead and at least one dummy lead that has a first wire bonding area and a second wire bonding area. A first die is attached on a top surface of the flag and electrically connected to the first wire bonding area of the dummy lead with a first bond wire. The first die, the first bond wire and the first wire bonding area of the dummy lead are encapsulated with a molding material, wherein a cavity is formed in the molding material above the first die with an opening, and wherein the second wire bonding area of the dummy lead is exposed in the cavity. The semiconductor device further includes a second die attached on a bottom surface of the cavity and electrically connected to the second wire bonding area of the dummy lead with a second bond wire.

In another embodiment, the present invention provides a semiconductor device including a lead frame having a flag, a plurality of leads surrounding the flag and at least one tie bar extending outward from the flag, wherein the tie bar has a first wire bonding area and a second wire bonding area. A first die is attached on a top surface of the flag and electrically connected to the first wire bonding area of the tie bar with a first bond wire. The first die, the first bond wire and the first wire bonding area of the tie bar are encapsulated with a molding material, wherein the molding material includes a cavity above the first die with an opening, and wherein the second wire bonding area of the tie bar is exposed in the cavity. The semiconductor device further includes a second die attached on a bottom surface of the cavity and electrically connected to the second wire bonding area of the tie bar with a second bond wire.

In a further embodiment, the present invention provides a method for assembling a multi-die sensor device. The method includes providing a lead frame having a flag and a plurality of leads surrounding the flag, wherein the plurality of leads comprises at least one normal lead and at least one dummy lead that has a first wire bonding area and a second wire bonding area; attaching a first die on the flag; electrically connecting the first die to the first wire bonding area of the dummy lead with a first bond wire; encapsulating the first die, the first bond wire and the first wire bonding area of the dummy lead with a molding material; forming a cavity in the molding material above the first die with an opening, wherein the second wire bonding area of the dummy lead is exposed in the cavity; and attaching a second die on a bottom surface of the cavity and electrically connecting the second die to the second wire bonding area of the dummy lead with a second bond wire.

Figure 2A:
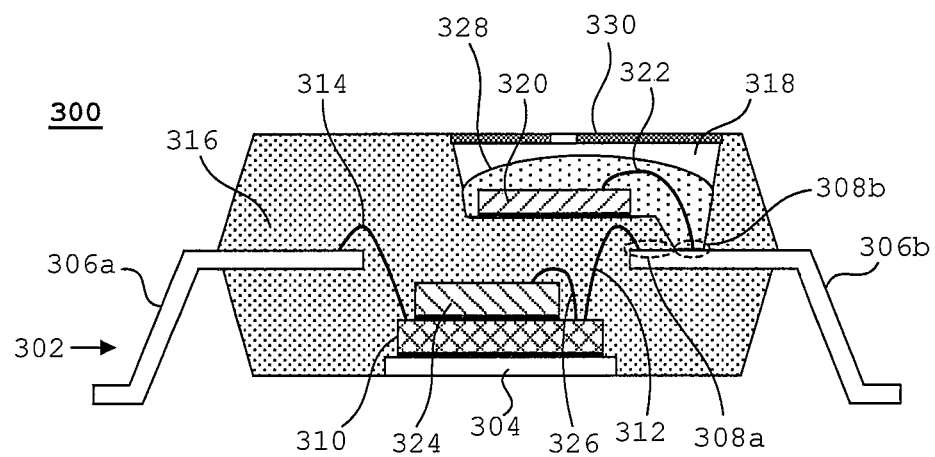
FIGS. 2A-2C are cross-sectional side views of various multi-die sensor devices in accordance with embodiments of the present invention.

Referring now to FIG. 2A, a cross-sectional side view of a semiconductor device 300 in accordance with a first embodiment of the present invention is shown. The semiconductor device 300 includes a lead frame 302 having a flag 304 and a plurality of leads surrounding the flag 304. The plurality of leads includes at least one normal lead 306a and at least one dummy lead 306b that has a first wire bonding area 308a and a second wire bonding area 308b. The differences between the normal lead 306a and the dummy lead 306b will be described later. The semiconductor device 300 also has three integrated circuits dies, a first die 310 that in one embodiment is a MCU, a second die 320 that is a pressure sensor, and a third die 324 that in one embodiment is a gravity sensor.

The first die or MCU 310 is attached on a top surface of the flag 304 and electrically connected to the first wire bonding area 308a of the dummy lead 306b with a first bond wire 312. In a preferred embodiment, the MCU 310 is also electrically connected to the normal lead 306a with a second bond wire 314. The MCU 310, the first and second bond wires 312, 314, and the first wire bonding area 308a of the dummy lead 306b are encapsulated with a mold compound 316. During the molding process, a cavity 318 with an opening is formed in the mold compound 316 above the MCU 310. The cavity 318 may be formed via Pin Assisted or Film Assisted Molding (FAM). The cavity 218 causes the second wire bonding area 308b of the dummy lead 306b to be exposed, while at the same time protecting the bond wires 312, 314 (and 326). To reduce package height and accommodate a thicker die, an exposed flag 304 is preferable. However, use of a non-exposed flag lead frame is also feasible.

The second die or pressure sensor 320 is attached on a bottom surface of the cavity 318 and electrically connected to the second wire bonding area 308b of the dummy lead 306b with a third bond wire 322. The second die 320 is electrically connected to the first die 310 via the dummy lead 306b.

In a preferred embodiment, the semiconductor device 300 includes the third die or gravity sensor 324, which is attached on a top surface of the first die 310 and electrically connected to the first die 310 with a fourth bond wire 326. The third die 324 and the fourth bond wire 326 also are encapsulated in and protected by the mold compound 316. In a preferred embodiment, a gel 328 is disposed on a top surface of the second die 320, preferably coating the second die 320 and the third bond wire 322. In a further preferred embodiment, a lid 330 with a hole is attached over the cavity opening such that the lid 330 covers the second die 320, the third bond wire 322 and the gel 328. In one embodiment, the lid 330 is formed from metal.

As is apparent from the above description, the normal lead 306a provides for external connection to the MCU 310, while the dummy lead 306b enables an electrical connection between the MCU 310 and the pressure sensor 320. The external or outer lead part of the dummy lead 306b is not meant to provide an external connection, and in one embodiment of the invention, the outer lead portion of the dummy lead 306b is trimmed or cut off.

Figure 2B:
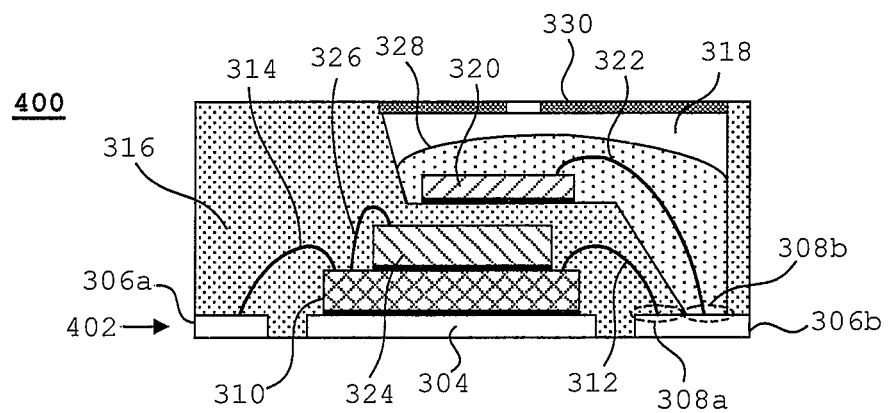

FIG. 2B shows a cross-sectional side view of a semiconductor device 400 in accordance with a second embodiment of the present invention. The second embodiment is similar to the first embodiment described above, except that the semiconductor device 400 is a Quad Flat No-lead (QFN) package, so the lead frame used is different. Thus, the semiconductor device 400 includes a lead frame 402 where the flag 304 and the leads 306a, 306b lie in the same plane. Therefore, the wire 322 from the pressure sensor 320 to the lead 306b is longer than the one for the device 300 and consequently the cavity 318 is larger for the device 400 than for the device 300.

Figure 2C:
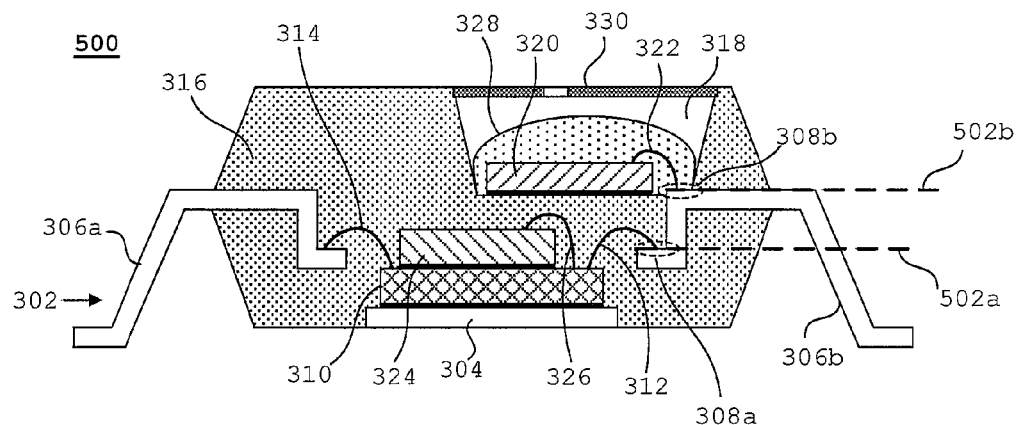

FIG. 2C shows a cross-sectional side view of a semiconductor device 500 in accordance with a third embodiment of the present invention. The third embodiment is similar to the first embodiment described above, except that the first wire bonding area 308a is formed in a first plane 502a and the second wire bonding area 308b is formed in a second plane 502b, with the first plane 502a being down-set from the second plane 502b. In a preferred embodiment, the first and second wire bonding areas 308a, 308b are formed in two separate planes by bending an inner part of the dummy lead 306b. Since a top surface of the second wire bonding area 308b of the dummy lead 306b is substantially planar with a bottom surface of the pressure sensor die 320, the cavity 318 has a more uniform shape than the cavities of the devices 300 and 400. Therefore, the device 500 requires less of the gel material 328 to cover the pressure sensor 320 and bond wire 322.

Figure 3:
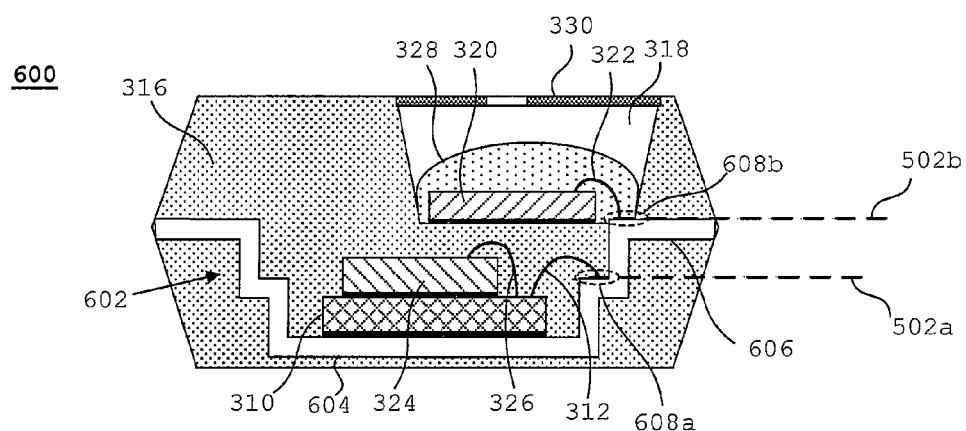
FIG. 3 is a cross-sectional view of another multi-die sensor device in accordance with an embodiment of the present invention.

FIG. 3 is a cross-sectional side view of a semiconductor device 600 in accordance with a fourth embodiment of the present invention. The semiconductor device 600 includes a lead frame 602 having a flag 604, a plurality of leads (not shown) surrounding the flag 604 and at least one tie bar 606 extending outward from the flag 604, which is known in the art. The tie bar 606 includes a first wire bonding area 608a and a second wire bonding area 608b. A first die 310 is attached on a top surface of the flag 604 and electrically connected to the first wire bonding area 608a of the tie bar 606 with a first bond wire 312. In a preferred embodiment, the first die 310 is electrically connected to at least one of the plurality of leads with a second bond wire (not shown).

The first die 310, the first bond wire 312, the second bond wire and the first wire bonding area 608a of the tie bar 606 are encapsulated with a mold compound 316. A cavity 318 is formed in the mold compound 316 above the first die 310 with an opening and the second wire bonding area 608b of the tie bar 606 is exposed in the cavity 318. The semiconductor device 600 further includes a second die 320 attached on a bottom surface of the cavity 318 and electrically connected to the second wire bonding area 608b of the tie bar 606 with a third bond wire 322. The first die 310 is protected by the mold compound 316. The second die 320 is electrically connected to the first die 310 via the tie bar 606.

In a preferred embodiment, a third die 324 is attached on a top surface of the first die 310 and electrically connected to the first die 310 with a fourth bond wire 326. The third die 324 and the fourth bond wire 326 also are encapsulated in the mold compound 316. In one embodiment, the first die 310 is a MCU, the second die 320 is a pressure sensor and the third die 324 is a gravity sensor.

A gel 328 is disposed on a top surface of the second die 320 preferably coating the second die 320 and the third bond wire 322. A lid 330 with a hole is attached over the cavity opening such that the lid 330 covers the second die 320, the third bond wire 322 and the gel 328. In one embodiment, the lid 330 is constructed of metal such as by punching or stamping.

In a preferred embodiment, the first wire bonding area 608a is formed in a first plane 502a and the second wire bonding area 608b is formed in a second plane 502b, where the first plane 502a is down-set from the second plane 502b. In a preferred embodiment, the first and second wire bonding areas 608a, 608b are formed in two separate planes by bending the tie bar 606.

Figure 4:
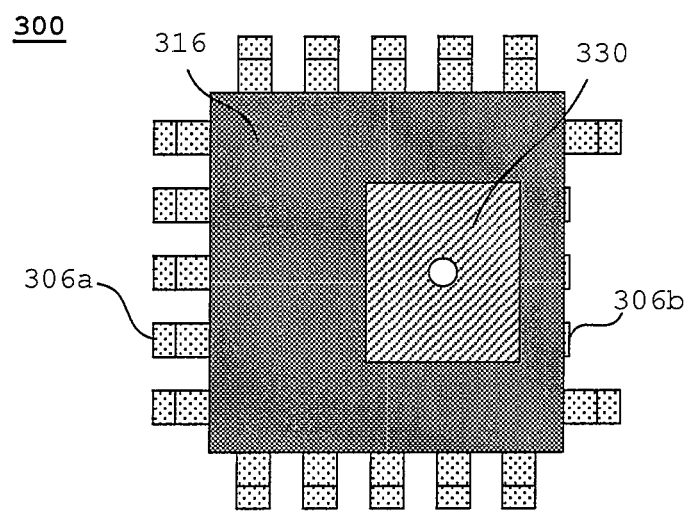
FIG. 4 is a top plan view of a multi-die sensor device in accordance with embodiments of the present invention.

FIG. 4 is a top plan view of the assembled semiconductor device 300 in accordance with an embodiment of the present invention. An outer part of the dummy leads 306b that extends outside of the mold compound 316 is trimmed off to avoid any active connection to the dummy lead 306b at the board level.

Figure 5:
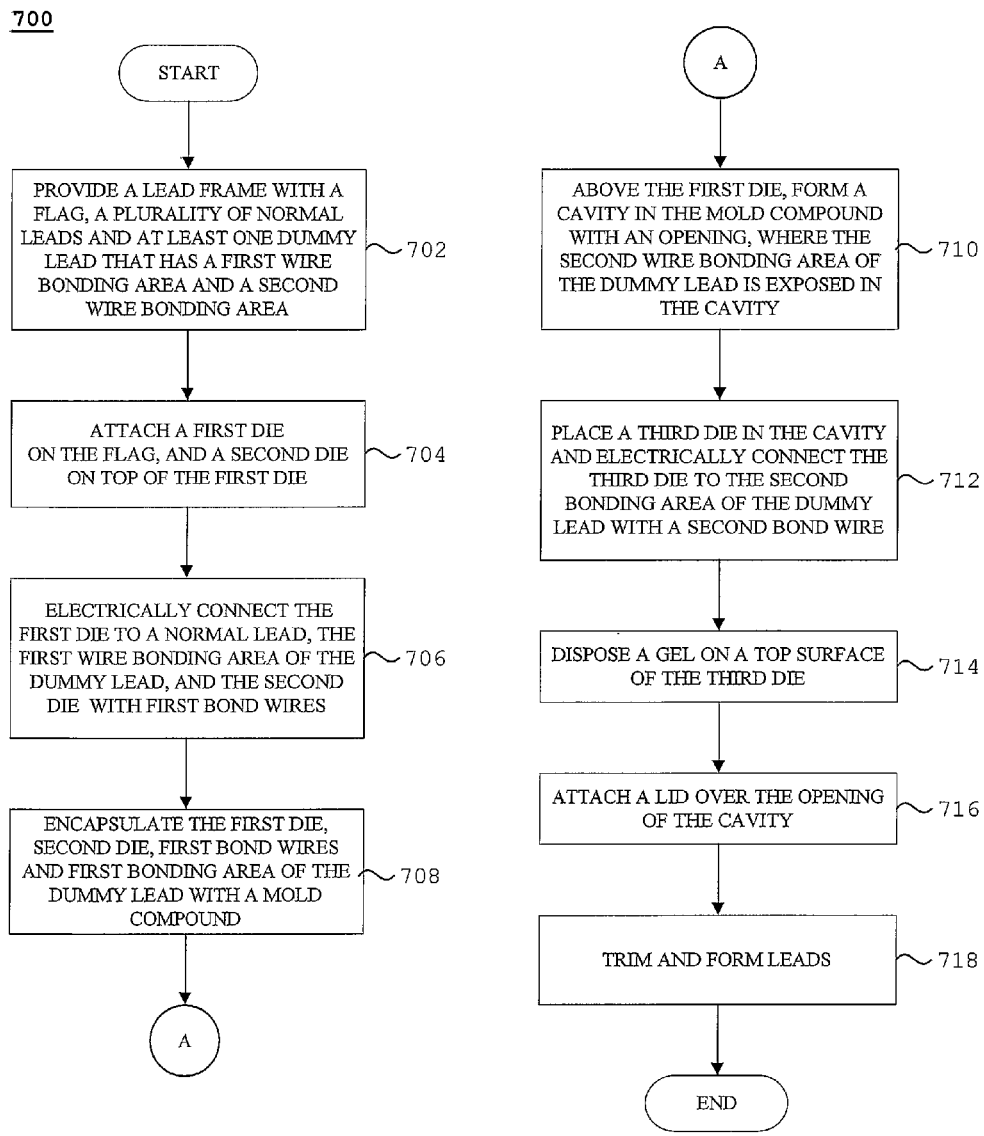
FIG. 5 is a flow chart illustrating a method of assembling a multi-die sensor device in accordance with an embodiment of the present invention.

Referring now to FIG. 5, a flow chart of a method 700 of assembling a semiconductor device as described above with reference to FIGS. 2C and 4 is shown.

The method 700 starts at 702 by providing a lead frame 302 having a flag 304 and a plurality of leads surrounding the flag 304, wherein the plurality of leads comprises at least one normal lead 306a and at least one dummy lead 306b that has a first wire bonding area 308a and a second wire bonding area 308b. In a preferred embodiment, the first wire bonding area 308a is formed in a first plane 502a and the second wire bonding area 308b is formed in a second plane 502b preferably by bending the dummy lead 306b, wherein the first plane 502a is down-set from the second plane 502b.

At 704, a first die 310 is attached on a top surface of the flag 304 with a die attach material such as an epoxy. In a preferred embodiment, a second die 324 is further attached on a top surface of the first die 310. For example, the first die 310 is a MCU die and the second die 324 is a gravity sensor die.

At 706, the first die 310 is electrically connected to the normal lead 306a, the first wire bonding area 308a of the dummy lead 306b and the second die 324 with a set of first bond wires 314, 312 and 326.

At 708, the first die 310, the second die 324, the first bond wires 314, 312 and 326, and first wire bonding area 308a of the dummy lead 306b are encapsulated with a mold compound 316. In a preferred embodiment, a bottom surface of the flag 304 is exposed from the mold compound 306.

At 710, a cavity 318 is formed in the mold compound 316 above the first die 310 and the second die 324 with an opening, wherein the second wire bonding area 308b of the dummy lead 306b is exposed in the cavity 318. In a preferred embodiment, the cavity 318 is formed by disposing a mold pin over the first die 310, the second die 324, the first bond wires 314, 312 and 326, and the first bonding area 308a of the dummy lead 306b with the mold compound 316. In another preferred embodiment, the cavity 316 is created by an etching process.

At 712, a third die 320 is attached on a bottom surface of the cavity 318 and electrically connected to the second wire bonding area 308b of the dummy lead 306b with a second bond wire 322. For example, the third die 320 is a pressure sensor die.

At 714, a gel 328 is disposed on a top surface of the third die 320. In a preferred embodiment, the third die 320 and the second bond wire 322 are coated by the gel 328.

At 716, a lid 330 with a hole is attached over the opening of the cavity 318 such that the lid 330 covers the third die 320, the second bond wire 322 and the gel 328. For example, the lid 330 is a metal lid.

At 718, as shown in FIG. 4, in a preferred embodiment, an outer part of the dummy lead 306b that is exposed out of the mold compound 316 is trimmed off to avoid any active connection to the dummy lead 306b at board level. As shown in FIG. 2C, the normal lead 306a is formed to a gull-wing shape. However, the normal lead 306a may also be formed to other shapes such as J shape, which is known in the art.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor device, comprising:
   a lead frame having a flag and a plurality of leads surrounding the flag, wherein the plurality of leads comprises at least one normal lead and at least one dummy lead that has a first wire bonding area formed in a first plane and a second wire bonding area formed in a second plane, wherein the first plane is down-set from the second plane;
   a first die attached on a top surface of the flag and electrically connected to the first wire bonding area of the dummy lead with a first bond wire;
      a molding material encapsulating the first die, the first bond wire and the first wire bonding area of the dummy lead, wherein a cavity is formed in the molding material above the first die with an opening, and wherein the second wire bonding area of the dummy lead is exposed in the cavity, and is not lower than a bottom surface of the cavity; and
   a second die attached on the bottom surface of the cavity and electrically connected to the second wire bonding area of the dummy lead with a second bond wire.

2. The semiconductor device of claim 1, further comprising:
   a gel material disposed on a top surface of the second die; and
   a lid with a hole attached over the opening in the cavity such that the lid covers the second die, the second bond wire and the gel material.

3. The semiconductor device of claim 1, further comprising:
a third bond wire electrically connecting the first die to the normal lead.

4. The semiconductor device of claim 1, further comprising:
a third die attached on a top surface of the first die and electrically connected to the first die with a fourth bond wire.

5. The semiconductor device of claim 1, wherein a bottom surface of the flag is exposed from the molding material.

6. The semiconductor device of claim 1, wherein an outer part of the dummy lead exposed out of the molding material is trimmed off.

7. A semiconductor device, comprising:
a lead frame having a flag, a plurality of leads surrounding the flag and at least one tie bar extending outward from the flag, wherein the tie bar includes a first wire bonding area formed in a first plane and a second wire bonding area formed in a second plane, wherein the first plane is down-set from the second plane;
a first die attached on a top surface of the flag and electrically connected to the first wire bonding area of the tie bar with a first bond wire;
a molding material encapsulating the first die, the first bond wire and the first wire bonding area of the tie bar, wherein
a cavity is formed in the molding material above the first die with an opening, and wherein the second wire bonding area of the tie bar is exposed in the cavity, and is not lower than a bottom surface of the cavity; and
a second die attached on the bottom surface of the cavity and electrically connected to the second wire bonding area of the tie bar with a second bond wire.

8. The semiconductor device of claim 7, further comprising:
a gel material disposed on a top surface of the second die; and
a lid with a hole attached over the opening in the cavity that covers the second die, the second bond wire and the gel material.

9. The semiconductor device of claim 7, further comprising:
a third bond wire electrically connecting the first die to one of the plurality of leads.

10. The semiconductor device of claim 7, further comprising:
a third die attached on a top surface of the first die and electrically connected to the first die with a fourth bond wire.

* * * * *